US008992788B2

(12) United States Patent  
Igarashi et al.

(10) Patent No.: US 8,992,788 B2
(45) Date of Patent: Mar. 31, 2015

(54) EVALUATION OF ETCHING CONDITIONS FOR PATTERN-FORMING FILM

(71) Applicant: Shin-Etsu Chemical Co., Ltd., Tokyo (JP)

(72) Inventors: Shinichi Igarashi, Joetsu (JP); Hiroki Yoshikawa, Joetsu (JP); Yukio Inazuki, Joetsu (JP); Hideo Kaneko, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/678,714

(22) Filed: Nov. 16, 2012

(65) Prior Publication Data

US 2013/0126471 A1 May 23, 2013

(30) Foreign Application Priority Data

Nov. 18, 2011 (JP) ................................. 2011-252970

(51) Int. Cl.
*C03C 15/00* (2006.01)
*G06F 19/00* (2011.01)
*G03F 1/26* (2012.01)
*G03F 1/80* (2012.01)
*G03F 1/00* (2012.01)

(52) U.S. Cl.
CPC ........ *G06F 19/00* (2013.01); *G03F 1/26* (2013.01); *G03F 1/80* (2013.01); *G03F 1/0046* (2013.01)
USPC ....... 216/41; 216/37; 216/67; 430/5; 430/319

(58) Field of Classification Search
USPC .................. 216/37, 41, 67; 430/5, 319
See application file for complete search history.

(56) References Cited

U.S. PATENT DOCUMENTS

| 6,544,894 | B1* | 4/2003 | Kobayashi ................. 430/5 |
| 2006/0088774 | A1 | 4/2006 | Yoshikawa et al. |
| 2007/0212618 | A1 | 9/2007 | Yoshikawa et al. |
| 2007/0212619 | A1 | 9/2007 | Yoshikawa et al. |
| 2009/0155698 | A1* | 6/2009 | Yamada et al. ............. 430/5 |
| 2009/0253054 | A1 | 10/2009 | Kominato et al. |
| 2012/0100470 | A1 | 4/2012 | Nozawa et al. |

FOREIGN PATENT DOCUMENTS

| EP | 1832926 | * | 3/2007 |
| EP | 1 832 926 | A2 | 9/2007 |

(Continued)

OTHER PUBLICATIONS

The Office Action, dated Nov. 12, 2014, issued in the corresponding Taiwanese Patent Application No. 101142892.

(Continued)

*Primary Examiner* — Lan Vinh
*Assistant Examiner* — Maki Angadi
(74) *Attorney, Agent, or Firm* — Birch, Stewart, Kolasch & Birch, LLP

(57) ABSTRACT

In conjunction with a photomask blank comprising a transparent substrate, a pattern-forming film, and an etch mask film, a set of etching conditions for the pattern-forming film is evaluated by measuring a first etching clear time (C1) taken when the etch mask film is etched under the etching conditions to be applied to the pattern-forming film, measuring a second etching clear time (C2) taken when the pattern-forming film is etched under the etching conditions, and computing a ratio (C1/C2) of the first to second etching clear time.

15 Claims, 1 Drawing Sheet

(56) References Cited

FOREIGN PATENT DOCUMENTS

| EP | 1 832 926 A3 | 12/2007 |
| JP | 2003-195479 A | 7/2003 |
| JP | 2007-241060 A | 9/2007 |
| JP | 2007-241065 A | 9/2007 |
| TW | 200624998 | 7/2006 |
| WO | WO 2010/147172 A1 | 12/2010 |

OTHER PUBLICATIONS

The extended European search report, dated Oct. 21, 2014, issued in the corresponding European Patent Application No. 12192907.9.

* cited by examiner

US 8,992,788 B2

EVALUATION OF ETCHING CONDITIONS FOR PATTERN-FORMING FILM

CROSS-REFERENCE TO RELATED APPLICATION

This non-provisional application claims priority under 35 U.S.C. §119(a) on Patent Application No. 2011-252970 filed in Japan on Nov. 18, 2011, the entire contents of which are hereby incorporated by reference.

TECHNICAL FIELD

This invention relates to a method of evaluating a set of etching conditions for a pattern-forming film of a photomask blank which is processed to form a photomask for use in the micro-fabrication of semiconductor integrated circuits, charge-coupled devices (CCD), liquid crystal display (LCD) color filters, and magnetic heads. More particularly, in conjunction with a photomask blank comprising a pattern-forming film and an etch mask film, the invention relates to a method of evaluating a set of etching conditions for the pattern-forming film.

BACKGROUND ART

In the recent semiconductor processing technology, a challenge to higher integration of large-scale integrated circuits places an increasing demand for miniaturization of circuit patterns. There are increasing demands for further reduction in size of circuit-constructing wiring patterns and for miniaturization of contact hole patterns for cell-constructing interlayer connections. As a consequence, in the manufacture of circuit pattern-written photomasks for use in the photolithography of forming such wiring patterns and contact hole patterns, a technique capable of accurately writing finer circuit patterns is needed to meet the miniaturization demand.

In order to form a higher accuracy photomask pattern on a photomask substrate, it is of first priority to form a high accuracy resist pattern on a photomask blank. Since the photolithography carries out reduction projection in actually processing semiconductor substrates, the photomask pattern has a size of about 4 times the actually necessary pattern size, but an accuracy which is not loosened accordingly. The photomask serving as an original is rather required to have an accuracy which is higher than the pattern accuracy following exposure.

Further, in the currently prevailing lithography, a circuit pattern to be written has a size far smaller than the wavelength of light used. If a photomask pattern which is a mere 4-time magnification of the circuit feature is used, a shape corresponding to the photomask pattern is not transferred to the resist film due to influences such as optical interference occurring in the actual photolithography operation. To mitigate these influences, in some cases, the photomask pattern must be designed to a shape which is more complex than the actual circuit pattern, i.e., a shape to which the so-called optical proximity correction (OPC) is applied, or the photomask pattern must be designed while taking into account optical interference. Thus, at the present, the lithography technology for obtaining photomask patterns also requires a higher accuracy processing method. The lithographic performance is sometimes represented by a maximum resolution. As to the resolution limit, the lithography involved in the photomask processing step is required to have a maximum resolution accuracy which is equal to or greater than the resolution limit necessary for the photolithography used in a semiconductor processing step using a photomask.

A photomask pattern is generally formed by applying a photoresist film on a photomask blank having a light-shielding film on a transparent substrate, writing a pattern using electron beam, and developing to form a resist pattern. Using the resulting resist pattern as an etch mask, the light-shielding film is etched into a light-shield pattern. In an attempt to miniaturize the light-shield pattern, if processing is carried out while maintaining the thickness of the resist film at the same level as in the art prior to the miniaturization, the ratio of film thickness to pattern width, known as "aspect ratio," becomes higher. As a result, the resist pattern profile is degraded, preventing effective pattern transfer, and in some cases, the resist pattern can collapse or be stripped. Therefore, the thickness of resist film must be reduced to enable miniaturization.

As to the light-shielding film material to be etched through the resist pattern as etch mask, a number of materials are known in the art. Among others, chromium compound films are used in practice because many teachings about etching are available and their processing has been established as the standard process. For example, a photomask blank having a light-shielding film composed of a chromium compound suited for ArF excimer laser lithography is disclosed in JP-A 2003-195479. Specifically a chromium compound film having a thickness of 50 to 77 nm is described.

A typical dry etching process for chromium-based films such as chromium compound films is oxygen-containing chlorine base dry etching, which has a certain etching ability relative to organic film. Thus, when etching is conducted through a thinner resist film in order to transfer a finer size pattern for the above-described reason, the resist film can be damaged during etching. It is then difficult to transfer the resist pattern accurately. To meet both the requirements of miniaturization and accuracy, it becomes necessary to investigate the light-shielding material again so as to facilitate the processing of light-shielding film, rather than the current trend relying solely on resist performance improvement.

As to the light-shielding film material, silicon-based materials (e.g., materials containing silicon, or silicon and transition metal) allow for high accuracy processing as compared with the chromium-based materials used in the prior art. This is because the silicon-based materials have good light-shielding properties relative to exposure light of 200 nm or shorter, and can be processed by fluorine base dry etching which causes least damage to the resist pattern. See JP-A 2007-241065.

As to the technique of high accuracy processing using an etch mask, JP-A 2007-241060 discloses that the processing error associated with pattern dependency and side etching is reduced if a light-shielding film of silicon-based material is processed using a chromium-based material as the etch mask. Then, a light-shielding film of silicon-based material to be combined with an etch mask film of chromium-based material is regarded promising as the light-shielding material of the next generation.

CITATION LIST

Patent Document 1: JP-A 2003-195479
Patent Document 2: JP-A 2007-241065
Patent Document 3: JP-A 2007-241060
  (US 20070212619, EP 1832926)

SUMMARY OF INVENTION

As the pattern size on the photomask is reduced, the resist film must be thinner. To form a photomask pattern having a feature size of 50 nm or less, a resist film having a thickness of 150 nm or less is required. The etch mask film optimized for such a thin resist film should have a thickness of 30 nm or less. On use of such etch mask film, a thinner etch mask film is desirable because the resist film can also be thin. However, if the etch mask film is chosen only from the aspect of thinning, a problem arises that the pattern of the pattern-forming film contains defects or the pattern is not formed to the design. Also, the etch mask film is preferably resistant to the etching of the pattern-forming film. However, the film which is resistant to the etching of the pattern-forming film is often resistant to the etching of the etch mask film as well. Then the resist film intended for patterning of the etch mask film cannot be thin.

The etch mask film must have at least a sufficient thickness to ensure that the film is left until the etching of the pattern-forming film is complete. On the other hand, the etch mask film should be as thin as possible so that it may be patterned without causing substantial damages to the resist film.

Depending on certain conditions, etching of the pattern-forming film may cause substantial damages to the etch mask film, and if the etch mask film has a reduced thickness, cause even a loss of the etch mask film, that is, negate the function of etch mask.

An object of the invention is to provide a method of evaluating a set of etching conditions for a pattern-forming film, which enables to evaluate both the etch resistance of an etch mask film during etching of the pattern-forming film and the etchability of the pattern-forming film during etching of the pattern-forming film itself whereby a satisfactory set of etching conditions for the pattern-forming film can be found.

Studying the etching behavior of an etch mask film, the inventors found that during etching of a pattern-forming film, the etch mask film is etched independent of the identity of material of which it is made, although the etching clear time is long.

Additionally it was found that defects are introduced in the pattern of the pattern-forming film, typically light-shielding film, because the resist film serving as an etch mask during patterning of the etch mask film can be etched during patterning of the etch mask film, and also because the etch mask film serving as an etch mask during patterning of the pattern-forming film can be etched during patterning of the pattern-forming film.

Etching selectivity is different between the pattern-forming film and the etch mask film, depending on etching conditions. Thus simply selecting a set of etching conditions providing a short etching clear time for the pattern-forming film may sometimes fail in satisfactory processing.

The invention pertains to a photomask blank comprising a transparent substrate, a pattern-forming film on the substrate for forming a photomask pattern, and an etch mask film on the pattern-forming film for serving as a mask during etching of the pattern-forming film. It is intended herein that both the etch resistance of the etch mask film during etching of the pattern-forming film and the etchability of the pattern-forming film during its own etching are evaluated in a relative manner. It has been found that etching conditions can be evaluated by measuring a first etching clear time (C1) taken when the etch mask film is etched under the etching conditions to be applied to the pattern-forming film when a photomask pattern is formed from the pattern-forming film, measuring a second etching clear time (C2) taken when the pattern-forming film is etched under the etching conditions, and computing a ratio (C1/C2) of the first to second etching clear time. Then a proper set of etching conditions can be selected.

In conjunction with a photomask blank comprising a transparent substrate, a pattern-forming film on the substrate for forming a photomask pattern, and an etch mask film on the pattern-forming film for serving as a mask during etching of the pattern-forming film, the invention provides a method of evaluating a set of etching conditions for the pattern-forming film comprising the steps of:

measuring a first etching clear time (C1) taken when the etch mask film is etched under the etching conditions to be applied to the pattern-forming film when a photomask pattern is formed from the pattern-forming film, measuring a second etching clear time (C2) taken when the pattern-forming film is etched under the etching conditions, and computing a ratio (C1/C2) of the first to second etching clear time, by which the set of etching conditions for the pattern-forming film is evaluated.

In a preferred embodiment, the etching to be applied to the pattern-forming film is fluorine base dry etching.

In a preferred embodiment, the pattern-forming film is formed of a material comprising silicon and another metal, and the etch mask film is formed of a silicon-free material comprising chromium.

Advantageous Effects of Invention

Using the evaluation method, a proper set of etching conditions for the pattern-forming film can be selected. When a photomask is prepared from a photomask blank under such a proper set of etching conditions, micro-patterning is possible because the etch mask film can be thin, and the transfer of the photomask pattern to the pattern-forming film is satisfactory. The resulting photomask has minimal pattern defects.

DESCRIPTION OF PREFERRED EMBODIMENTS

Figure 1:
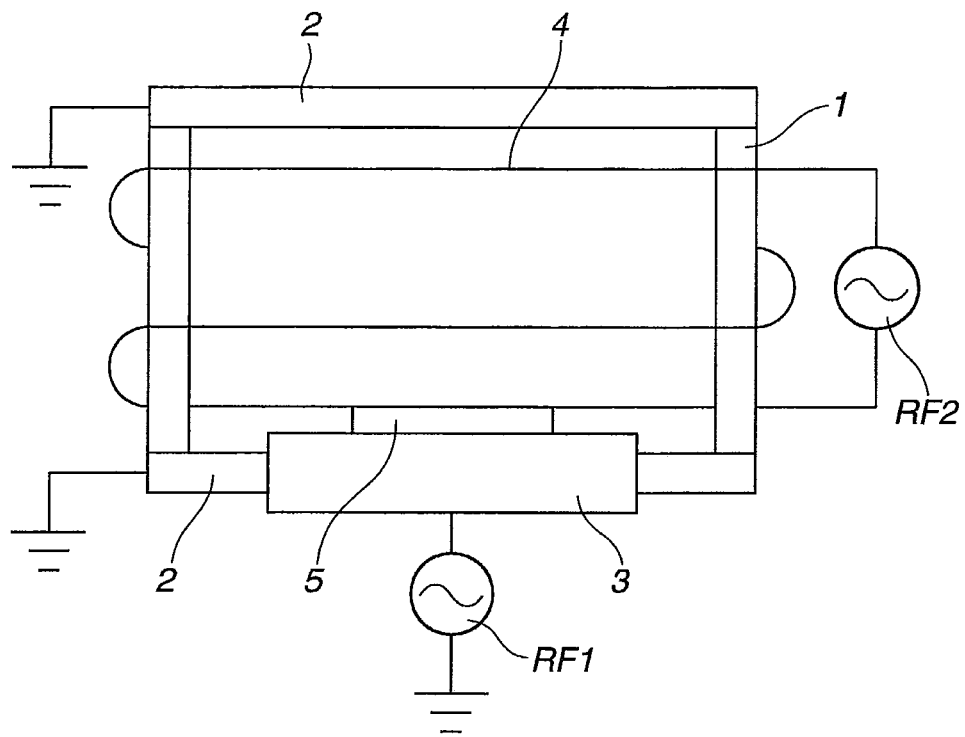
FIG. 1 schematically illustrates an exemplary dry etching system.

The terms "first", "second", and the like, as used herein do not denote any order, quantity, or importance, but rather are used to distinguish one element from another.

The invention pertains to a photomask blank comprising a transparent substrate such as quartz substrate, a pattern-forming film deposited on the substrate for forming a photomask pattern, and an etch mask film deposited on the pattern-forming film and serving as a mask during etching of the pattern-forming film. The method of the invention is to evaluate a set of etching conditions for the pattern-forming film formed below the etch mask film, preferably contiguous to the etch mask film.

Examples of the pattern-forming film include a light-shielding film adapted to form a light-shielding pattern upon fabrication of a photomask, and a phase shift film such as a halftone phase shift film adapted to form a phase shift pattern. That is, the pattern-forming film is a functional film affording an optical function as a photomask pattern when a photomask resulting from the photomask blank is used. On the other hand, the etch mask film is a film which exhibits etch resistance when the pattern-forming film is etched. The etch mask film is also known as "hard mask film" in that the film is used as the etch mask pattern when the pattern-forming film is etched. The pattern-forming film and etch mask film each may be a film of a single layer or multiple layers. The pattern-forming film may include an antireflective layer, adhesion-improving layer, protective layer or the like.

The pattern-forming film and etch mask film may have different etching performance. For example, one of the pattern-forming film and etch mask film, especially the pattern-forming film may be a film which is susceptible to fluorine base dry etching with fluorine base etchant gas such as $SF_6$ or $CF_4$, and less susceptible to chlorine base dry etching with chlorine base etchant gas containing chlorine and oxygen gases. Suitable such films include, for example, a silicon film, a film containing silicon, but not metals other than silicon, and a film containing silicon and another metal(s). Examples of the metals other than silicon include molybdenum, tungsten, tantalum and zirconium, and mixtures thereof. Of these; molybdenum is preferred for workability. These films may further contain one or more light elements selected from among oxygen, nitrogen, carbon and hydrogen.

The other film (which is an etch mask film if the one film is a pattern-forming film) may be a film which is less susceptible to fluorine base dry etching with fluorine base etchant gas such as $SF_6$ or $CF_4$, and susceptible to chlorine base dry etching with chlorine base etchant gas containing chlorine and oxygen gases. Suitable such films include, for example, a film of a silicon-free material containing chromium and a film of a silicon-free material containing tantalum. These films may further contain one or more light elements selected from among oxygen, nitrogen, carbon and hydrogen. It is noted that both the chlorine base etchant gas and the fluorine base etchant gas may further contain an inert gas such as helium or argon.

The combination of etchings is exemplified above by a combination of fluorine base dry etching using fluorine base etchant gas with chlorine base dry etching using chlorine base etchant gas containing chlorine gas and oxygen gas, but not limited thereto. Other combinations include, but are not limited to,
1) a combination of chlorine base dry etching using chlorine base etchant gas containing chlorine gas, but not oxygen gas with chlorine base dry etching using chlorine base etchant gas containing chlorine gas and oxygen gas;
2) a combination of two chlorine base dry etchings using chlorine base etchant gases containing chlorine gas and oxygen gas in a different ratio; and
3) a combination of fluorine base dry etching using fluorine base etchant gas with chlorine base dry etching using chlorine base etchant gas containing chlorine gas, but not oxygen gas.

The method of forming a photomask pattern from a pattern-forming film (typically light-shielding film) using an etch mask film is described by referring to one embodiment wherein a photomask is prepared from a photomask blank in which the pattern-forming film is a MoSi-based light-shielding film and the etch mask film is a chromium-based film.

First of all, a photomask blank is prepared by depositing a MoSi-based light-shielding film and a chromium-based etch mask film on a substrate in sequence. A resist film is formed on the chromium-based etch mask film. The resist film is processed to form a resist pattern, after which the etch mask film is patterned by chlorine base dry etching. Then the resist film is stripped off. While the etch mask film serves as an etch mask, the light-shielding film is patterned by fluorine base dry etching, whereby a photomask is obtained. If desired, the etch mask pattern may be removed.

To form a fine size photomask pattern at a high accuracy, a thinner resist film is recommended from the standpoint of aspect ratio. The thickness of a resist film depends on the etching time taken when the etch mask film is patterned. In order that a thin resist film allow for satisfactory patterning, the etching time of the etch mask film must be short. Satisfactory patterning within a short etching time is achievable by (1) designing the composition and construction of the etch mask film for a short etching clear time and/or (2) reducing the thickness of the etch mask film.

However, when the pattern-forming film such as a light-shielding film is patterned using the etch mask film, the etch mask film must be fully resistant to the etching of the pattern-forming film. An improvement in etch resistance is achievable by (3) designing the composition and construction of the etch mask film for a long etching clear time and/or (4) increasing the thickness of the etch mask film.

Meanwhile, the set of etching conditions for the pattern-forming film should be selected so as to provide for a short etching clear time for the pattern-forming film and a long etching clear time for the etch mask film.

According to the invention, a set of etching conditions for the pattern-forming film is evaluated by measuring a first etching clear time (C1) taken when the etch mask film is etched under the etching conditions to be applied to the pattern-forming film when a photomask pattern is formed from the pattern-forming film, measuring a second etching clear time (C2) taken when the pattern-forming film is etched under the etching conditions to be applied to the pattern-forming film when a photomask pattern is formed from the pattern-forming film, and computing a ratio (C1/C2) of the first to second etching clear time.

The method of the invention is an evaluation method in which the clear time ratio C1/C2 of first etching clear time C1 taken when the etch mask film is etched under the etching conditions to be applied to the pattern-forming film when a photomask pattern is formed from the pattern-forming film to second etching clear time C2 of etching of the pattern-forming film is utilized as a figure of merit (FOM), that is, the clear time ratio C1/C2 is an index for a set of etching conditions for the pattern-forming film.

The first etching clear time C1 corresponds to etch resistance of the etch mask film during etching of the pattern-forming film whereas the second etching clear time C2 corresponds to etchability during etching of the pattern-forming film itself. Accordingly, the higher the clear time ratio C1/C2 is, the better the results are. The clear time ratio C1/C2 is preferably at least 2, more preferably at least 5. The upper limit of the ratio C1/C2 is not critical. However, in a typical embodiment wherein the etch mask film is a chromium-based film and the light-shielding film is composed of MoSiN, for example, the ratio C1/C2 is up to 8 in the practical application.

If the pattern-forming film is etched under such a set of etching conditions as to give a higher clear time ratio C1/C2, then the etch mask film may be thin. As a result, the resist film used in patterning of that etch mask film may be thin enough to form a fine size pattern.

The "etching clear time" refers to a time passed from the start of etching until the underlying layer or substrate is exposed when the film is removed. The etching clear time may be determined by measuring the reflectivity of a film during etching and detecting a change of reflectivity, from which the completion of etching is judged, or if a film is visually observable during etching, by visually observing and confirming the exposure of the underlying layer or substrate, from which the completion of etching is judged. Alternatively, the etching clear time may be determined by analyzing the emission spectrum of a plasma in the etching chamber, analyzing a certain ion or element in the plasma, and detecting a spectral change, from which the completion of etching is judged.

The etching conditions include a flow rate and pressure of etchant gas, a power supplied to create a plasma, and the like. An exemplary dry etching system is illustrated in FIG. 1 as comprising a chamber 1, grounded plates 2, a lower electrode 3, an antenna coil 4, a substrate 5 to be treated, and radio frequency power supplies RF1 and RF2. When dry etching is carried out in this system, the power (RF1: reactive ion etching) applied to the substrate side (photomask blank side) and the power (RF2: inductively coupled plasma) applied to the induction coil may be adjusted.

The flow rate of etchant gas may be adjusted in a range of 0.1 to 100 sccm, the pressure of etchant gas adjusted in a range of 1 to 10 Pa, and the power adjusted in a range of 1 to 500 W. It is noted that the etching clear times may also be determined by continuously etching a stack of a pattern-forming film and an etch mask film, with the advantage that the evaluation time is shortened.

The thickness of the etch mask film may be determined in terms of the etching clear times of the etch mask film and pattern-forming film under the etching conditions for the pattern-forming film. It suffices that the etching clear time of the etch mask film is longer than the etching clear time of the pattern-forming film. The thickness of the etch mask film is determined such that the etching clear time of the etch mask film may be longer than the etching clear time of the pattern-forming film by a factor of 1.1 to 5, especially 1.2 to 3. As to the thickness of the etch mask film, a thinner film is preferred. However, too thin a film may allow for pattern defects whereas too thick a film may require a thicker resist film which is disadvantageous for fine size pattern formation and leads to larger pattern density dependence or optical proximity effect. For this reason, the thickness of the etch mask film is preferably in a range of 1 to 30 nm, more preferably 1 to 10 nm. The thickness of the resist film which is applied to the etch mask film within the above thickness range is preferably in a range of 30 to 200 nm, more preferably 30 to 150 nm, and even more preferably 30 to 100 nm. On the other hand, the thickness of the pattern-forming film, which varies with its optical function, is typically 10 to 100 nm, preferably 20 to 80 nm, relative to the etch mask film within the above thickness range.

The method of evaluating a set of etching conditions for a pattern-forming film according to the invention is effective for evaluating a set of etching conditions for the relevant film in a binary photomask blank comprising a transparent substrate, a light-shielding film formed as the pattern-forming film on the substrate, and an etch mask film formed thereon, and a phase shift mask blank comprising a transparent substrate, a phase shift film (typically halftone phase shift film) formed as the pattern-forming film on the substrate, an optional light-shielding film formed thereon, and an etch mask film formed thereon.

EXAMPLE

Examples of the invention are given below by way of illustration and not by way of limitation.

Example 1

Photomask blank samples were prepared by depositing a light-shielding film of MoSi-based material on a quartz substrate, and depositing a film of chromium-based material thereon as an etch mask film. Specifically, the light-shielding film was composed of MoSiN and the etch mask film was composed of chromium. The deposition time was adjusted such that the light-shielding film had a thickness of 60 nm and the etch mask film had a thickness of 5 nm.

Using the etching system of FIG. 1, the light-shielding film of MoSi-based material and the etch mask film of chromium-based material thus deposited were subjected to fluorine base dry etching under seven sets of etching conditions A to G. The etching clear time was determined. The set of etching conditions is shown in Table 1.

TABLE 1

| Etching condition set | Gas pressure (mTorr) | Power (W) | | Gas flow rate (sccm) | | |
|---|---|---|---|---|---|---|
| | | RF1 | RF2 | $SF_6$ | $O_2$ | He |
| A | 5 | 54 | 325 | 18 | 45 | 0 |
| B | 5 | 54 | 325 | 18 | 45 | 130 |
| C | 5 | 54 | 150 | 18 | 45 | 0 |
| D | 5 | 54 | 325 | 9 | 45 | 0 |
| E | 5 | 100 | 325 | 18 | 45 | 130 |
| F | 5 | 100 | 150 | 18 | 45 | 0 |
| G | 5 | 100 | 325 | 9 | 45 | 0 |

RF1: reactive ion etching (RIE) + continuous wave oscillation (CW)
RF2: inductively coupled plasma (ICP) + continuous wave oscillation (CW)

Figure 2:
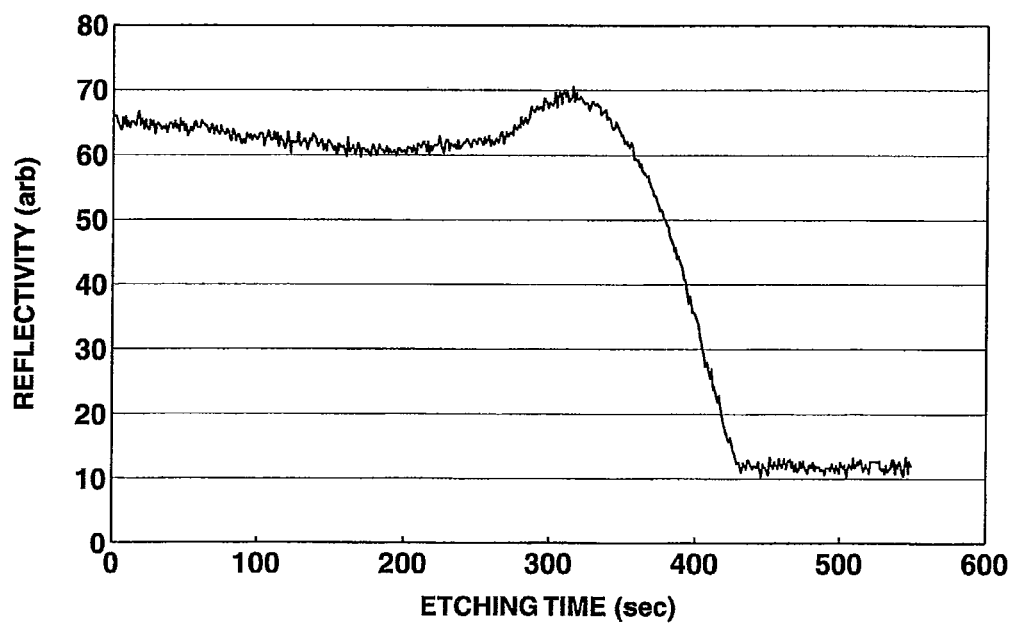
FIG. 2 is a diagram showing the reflectivity to inspection light of wavelength 675 nm as a function of time during etching under a set of etching conditions C in Example 1.

During the etching test, the reflectivity is monitored using inspection light of wavelength 675 nm, to determine a change of reflectivity with time. FIG. 2 shows a change of reflectivity with time in the etching test under condition set C. Once the chromium-based material film is completely etched, etching of the light-shielding film of MoSi-based material starts. As the light-shielding film loses its thickness, the reflectivity decreases and eventually reaches the value of the reflectivity of the quartz substrate. For each etching set, the etching clear times are shown in Table 2.

TABLE 2

| | Etching clear time (sec) | | | |
|---|---|---|---|---|
| Etching condition set | (a) Cr-based film, C1 | (b) Cr-based film + MoSi-based film | (b − a) MoSi-based film, C2 | C1/C2 |
| A | 272 | 322 | 50 | 5.4 |
| B | 138 | 200 | 62 | 2.2 |
| C | 268 | 435 | 167 | 1.6 |
| D | 143 | 222 | 79 | 1.8 |
| E | 79 | 134 | 55 | 1.4 |
| F | 175 | 292 | 117 | 1.5 |
| G | 88 | 157 | 69 | 1.3 |

A clear time ratio C1/C2 was computed by dividing etching clear time C1 for the etch mask film by the etching clear time C2 for the light-shielding film as the pattern-forming film. Among etching condition sets A to G, set A shows the highest ratio C1/C2, indicating the best etching condition set.

Japanese Patent Application No. 2011-252970 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method of determining an etching condition for a pattern-forming film of a photomask blank comprising a transparent substrate, said pattern-forming film on the substrate for forming a photomask pattern, and an etch mask film on the pattern-forming film for serving as a mask during etching of the pattern-forming film, the method comprising the steps of:
i) forming a pattern-forming film on a transparent substrate;
ii) forming an etch mask film on the pattern-forming film;
iii) etching the etch mask film by fluorine base dry etching under an etching condition to be applied to the pattern-forming film, taken when a photomask pattern is formed from the pattern-forming film;
iv) measuring a first etching clear time (C1) of the etch mask film, which passed from beginning of etching until the etch mask film is removed and the pattern-forming film is exposed;
v) etching the pattern-forming film by fluorine base dry etching under said etching condition;
vi) measuring a second etching clear time (C2) of the pattern-forming film, which passed from beginning of etching until the pattern-forming film is removed and the substrate is exposed;
vii) computing a ratio (C1/C2) of the first etching clear time (C1) to the second etching clear time (C2), by which the etching condition for the pattern-forming film is determined; and
viii) selecting an etching condition having the ratio (C1/C2) of at least 2, wherein
the pattern-forming film is formed of a material comprising silicon or silicon and another metal, and
the etch mask film is formed of a silicon-free material comprising chromium or a silicon-free material comprising tantalum.

2. The method of claim 1, wherein the pattern-forming film is formed of a material comprising silicon and another metal, and
the etch mask film is formed of a silicon-free material comprising chromium.

3. The method of claim 2 wherein said another metal is selected from the group consisting of molybdenum, tungsten, tantalum and zirconium.

4. The method of claim 1, wherein the pattern-forming film is a light-shielding film, a phase shift film, an antireflective layer, an adhesion-improving layer or a protective layer.

5. The method of claim 4, wherein said another metal is selected from the group consisting of molybdenum, tungsten, tantalum and zirconium.

6. The method of claim 1, wherein the pattern-forming film is a light-shielding film.

7. The method of claim 6, wherein said another metal is selected from the group consisting of molybdenum, tungsten, tantalum and zirconium.

8. The method of claim 1, wherein said another metal is selected from the group consisting of molybdenum, tungsten, tantalum and zirconium.

9. The method of claim 1, wherein the pattern-forming film contains one or more elements selected from the group consisting of oxygen, nitrogen and carbon.

10. The method of claim 1, wherein the etch mask film contains one or more elements selected from the group consisting of oxygen, nitrogen and carbon.

11. The method of claim 1, wherein the fluorine base dry etching is applied with $SF_6$ or $CF_4$.

12. The method of claim 1 further comprising the step of selecting the etching condition having the ratio (C1/C2) in range of 2 to 8.

13. The method of claim 1, wherein
each of the first etching time (C1) and the second etching time (C2) is measured by a method comprising:
during the etching, radiating an inspection light to the etch mask film and the pattern-forming film and observing a reflectivity; and
determining the first etching time (C1) and the second etching time (C2), respectively, based on change of the reflectivity.

14. The method of claim 13, wherein the inspection light has 675 nm of wavelength.

15. A method of forming a pattern-forming film of a photomask blank comprising a transparent substrate, said pattern-forming film on the substrate for forming a photomask pattern, and an etch mask film on the pattern-forming film for serving as a mask during etching of the pattern-forming film, the method comprising the steps of:
i) forming a pattern-forming film on a transparent substrate;
ii) forming an etch mask film on the pattern-forming film;
iii) etching the etch mask film by fluorine base dry etching under an etching condition to be applied to the pattern-forming film, taken when a photomask pattern is formed from the pattern-forming film;
iv) measuring a first etching clear time (C1) of the etch mask film, which passed from beginning of etching until the etch mask film is removed and the pattern-forming film is exposed;
v) etching the pattern-forming film by fluorine base dry etching under said etching condition;
vi) measuring a second etching clear time (C2) of the pattern-forming film, which passed from beginning of etching until the pattern-forming film is removed and the substrate is exposed;
vii) computing a ratio (C1/C2) of the first etching clear time (C1) to the second etching clear time (C2), by which the etching condition for the pattern-forming film is determined;
viii) selecting an etching condition having the ratio (C1/C2) of at least 2; and
ix) forming a pattern-forming film having the selected etching condition on a transparent substrate, wherein
the pattern-forming film is formed of a material comprising silicon or silicon and another metal, and
the etch mask film is formed of a silicon-free material comprising chromium or a silicon-free material comprising tantalum.

* * * * *